United States Patent
Chien

(10) Patent No.: US 10,857,632 B1
(45) Date of Patent: Dec. 8, 2020

(54) METHOD FOR MANUFACTURING HIGH-EFFICIENCY PROTECTIVE PAPER HAVING FUNCTIONS OF HEAT DISSIPATION, HEAT CONDUCTION AND ELECTROMAGNETIC ABSORPTION

(71) Applicant: TRUSVAL TECHNOLOGY CO., LTD., Chu-Nan Township (TW)

(72) Inventor: Shih Pao Chien, Chu-Nan Township (TW)

(73) Assignee: Trusval Technology Co., Ltd., Maio-Li County (TW)

(*) Notice: Subject to any disclaimer, the term of this patent is extended or adjusted under 35 U.S.C. 154(b) by 87 days.

(21) Appl. No.: 16/421,779

(22) Filed: May 24, 2019

(51) Int. Cl.
| | |
|---|---|
| B23P 15/26 | (2006.01) |
| H05K 7/20 | (2006.01) |
| F28F 21/02 | (2006.01) |
| H05K 9/00 | (2006.01) |
| F28F 3/00 | (2006.01) |
| B05C 3/12 | (2006.01) |

(52) U.S. Cl.
CPC ............. *B23P 15/26* (2013.01); *B05C 3/125* (2013.01); *F28F 3/00* (2013.01); *F28F 21/02* (2013.01); *H05K 7/2039* (2013.01); *H05K 9/009* (2013.01); *H05K 9/0083* (2013.01); *Y10T 29/4935* (2015.01)

(58) Field of Classification Search
CPC ............ B05C 3/125; B05C 3/12; B05C 3/132
See application file for complete search history.

(56) References Cited

U.S. PATENT DOCUMENTS

| | | | | |
|---|---|---|---|---|
| 5,284,701 A | * | 2/1994 | Hamon | B05D 5/12 361/216 |
| 8,871,296 B2 | * | 10/2014 | Zhamu | H01L 31/1884 427/122 |
| 9,486,821 B2 | * | 11/2016 | Toyoshima | B05B 5/14 |
| 9,793,024 B2 | * | 10/2017 | Mott | H01B 1/20 |
| 10,109,386 B2 | * | 10/2018 | Mallires | C25B 3/00 |
| 10,570,265 B2 | * | 2/2020 | Cao | B05D 3/108 |
| 10,758,936 B2 | * | 9/2020 | Braley | B32B 5/26 |
| 2012/0282453 A1 | * | 11/2012 | Wang | B29C 70/62 428/299.1 |
| 2015/0274924 A1 | * | 10/2015 | Pandey | C08J 9/0076 428/304.4 |
| 2016/0215441 A1 | * | 7/2016 | Wang | B32B 5/26 |
| 2019/0233946 A1 | * | 8/2019 | Bruton | C23C 28/00 |

* cited by examiner

*Primary Examiner* — Jason L Vaughan
(74) *Attorney, Agent, or Firm* — Rosenberg, Klein & Lee

(57) ABSTRACT

A method for manufacturing a high-efficiency protective paper having functions of heat dissipation, heat conduction and electromagnetic absorption is disclosed herein. It comprises the steps of providing a thermal conductive composite to a substrate, wherein the thermal conductive composite is made by fully mixing a metal salt and a nano-scale magnetic metal oxide; evenly distributing the thermal conductive composite over the substrate to form a hybrid material; leveling and rolling the hybrid material to form a protective paper having a dense structure; and receiving and vacuum heating the protective paper.

9 Claims, 2 Drawing Sheets

METHOD FOR MANUFACTURING HIGH-EFFICIENCY PROTECTIVE PAPER HAVING FUNCTIONS OF HEAT DISSIPATION, HEAT CONDUCTION AND ELECTROMAGNETIC ABSORPTION

BACKGROUND OF THE INVENTION

1. Field of the Invention

The present invention relates to a method for manufacturing a high-efficiency protective paper having functions of heat dissipation, heat conduction and electromagnetic absorption, which enables to increases efficiency of 3-dimentional heat dissipation and conduction and to significantly absorb electromagnetic radiation.

2. Description of Related Art

With the rapid development of technology, the volume of electronic components tends to be decreased, and the density and performance of electronic components per unit area become increased. As a result, a total heat generation of the electronic component is yearly increased, and a traditional heat dissipating device cannot afford to dissipate the total heat generation quickly. If the heat generated by the electronic component is not removed efficiently, it will leads to an electronic ionization and a thermal stress situation of the electronic component, which reduces an overall stability and a service life of the electronic component. Accordingly, it is imperative to dissipate the heat generated from the electronic component to prevent a overheat situation thereof. In addition, constantly increasing the frequency and transmission speed of electronic components also results in serious situations of electromagnetic interference and electromagnetic wave spillover.

SUMMARY OF THE INVENTION

In view of the above-mentioned problems, the object of the present invention is to provide a method for manufacturing a high-efficiency protective paper having functions of heat dissipation, heat conduction and electromagnetic absorption, which enables to increase efficiency of 3-dimentional heat dissipation and conduction and to absorb electromagnetic radiation.

DETAILED DESCRIPTION OF THE PREFERRED EMBODIMENT

Hereinafter, an exemplary embodiment of the present invention will be described in detail with reference to the accompanying drawings.

Figure 1:
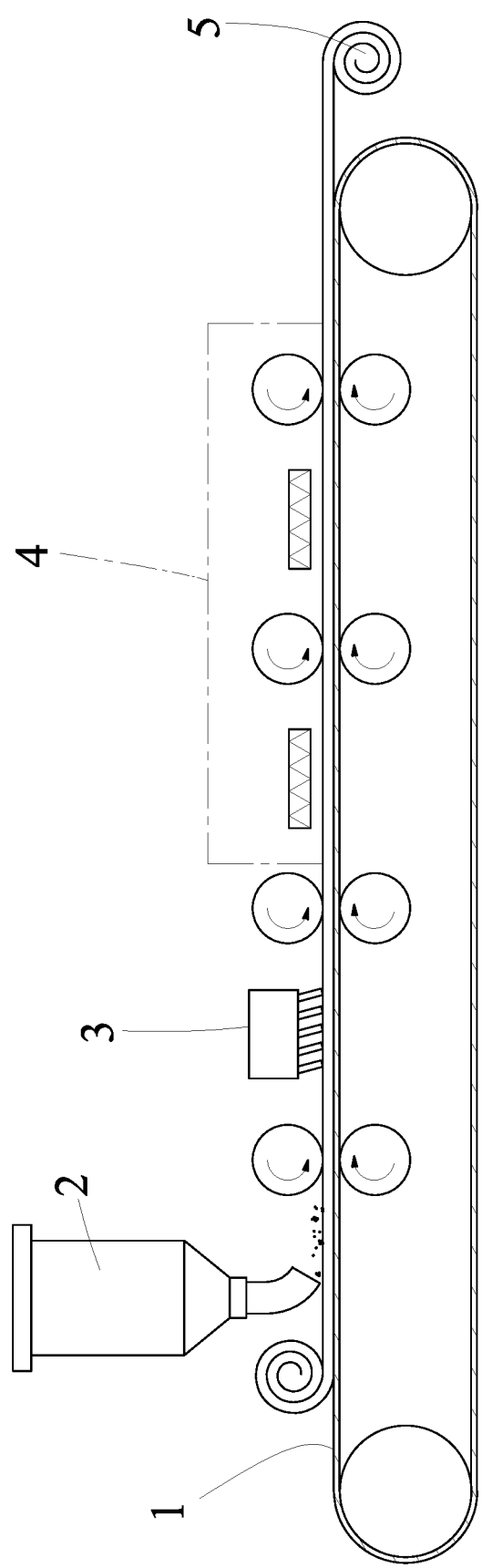
FIG. 1 is a flow chart showing equipment used in the present invention.
Figure 2:
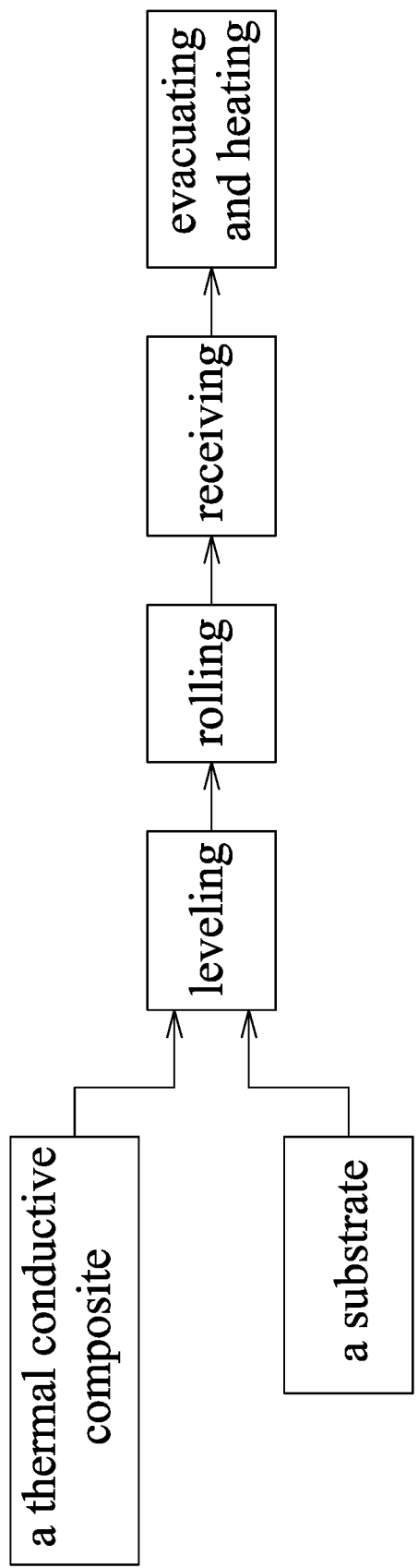
FIG. 2 is a flow chart showing a method for manufacturing a high-efficiency protective paper having functions of heat dissipation, heat conduction and electromagnetic absorption according to the present invention.

As showed in FIG. 1 and FIG. 2, a flow chart showing equipment used in the present invention and a flow chart showing a method for manufacturing a high-efficiency protective paper having functions of heat dissipation, heat conduction and electromagnetic absorption according to the present invention are disclosed. The method comprises the following steps of:

(a) transferring a substrate by a feeding mechanism (1), wherein the substrate is a fiber mesh fabric, a non-woven fabric, a carbon fiber fabric or a carbon fiber non-woven fabric;

(b) evenly distributing a thermal conductive composite in a feed tank (2) over the substrate to form a hybrid material, wherein the thermal conductive composite is made by is made by fully mixing one or more of graphene oxide, expanded graphite and oxidized carbon nanotube with a metal salt and a nano-scale magnetic metal oxide, and wherein the the metal salt is one or more of iron, cobalt, nickel, organic iron, organic nickel, organic cobalt, ferrocene, nickelocene and cobaltocene;

(c) leveling the hybrid material by a leveling mechanism (3) to flat a surface of the hybrid material;

(d) synchronously driving a roller for rolling the hybrid material by a rolling mechanism (4) to form a protective paper having a dense structure; preferably, the step (d) is repeated several times to achieve the dense structure;

(e) rolling up the protective paper by a receiving mechanism (5); and (f) cutting the protective paper into a size as needed to be further placed inside a vacuum furnace, evacuating the vacuum furnace to have a negative pressure of at least 0.001 Pa, heating the vacuum furnace to a temperature of at least 400° C. at a heating rate of 50° C. per minute, maintaining he temperature of at least 400° C. for at least 4 hours in the vacuum furnace, and naturally cooling the protective paper down to a temperature of 100° C. As a result, the preparation of the protective paper is completed, and the prepared protective paper is taken out from the vacuum furnace.

The protective paper has the metal salt, e.g. one or more of iron, cobalt, nickel, organic iron, organic nickel, organic cobalt, ferrocene, nickelocene, cobaltocene and the like, which can be decomposed into pure iron, cobalt or nickel at a high temperature to act as a catalyst for the graphene oxide, expanded graphite or oxidized carbon nanotube. Additionally, in a carbon source environment, the protective paper can form long graphene or carbon nanotube by a higher temperature of at least 400° C., so that the protective paper has a higher and long-lasting elasticity, which can rebound at least 50%. Accordingly, the protective paper can be reused and has high efficiency of 3-dimentional heat dissipation and conduction as well as efficient absorption of electromagnetic radiation.

Compared with the technique available now, the present invention has the advantages of improving efficiency of 3-dimentional heat dissipation and conduction of the electronic components and significantly absorbing electromagnetic radiation, so the present invention has increased practicality for the overall implementation

What is claimed is:

1. A method for manufacturing a high-efficiency protective paper having functions of heat dissipation, heat conduction and electromagnetic absorption, comprising the following steps of:

(a) transferring a substrate by a feeding mechanism;

(b) evenly distributing a thermal conductive composite in a feed tank over the substrate to form a hybrid material, wherein the thermal conductive composite is made by fully mixing a metal salt with a nano-scale magnetic metal oxide;

(c) leveling the hybrid material by a leveling mechanism to flat a surface of the hybrid material;

(d) synchronously driving a roller for rolling the hybrid material by a rolling mechanism to form a protective paper;

(e) rolling up the protective paper by a receiving mechanism; and (f) after rolling, cutting the protective paper and placing the protective paper inside a vacuum furnace, evacuating the vacuum furnace, heating the vacuum furnace to a temperature of at least 400° C., maintaining the temperature of at least 400° C. for a period of time in the vacuum furnace, and cooling the protective paper.

2. The method for manufacturing a high-efficiency protective paper having functions of heat dissipation, heat conduction and electromagnetic absorption as claimed in claim 1, wherein the substrate is a fiber mesh fabric, a non-woven fabric, a carbon fiber fabric or a carbon fiber non-woven fabric.

3. The method for manufacturing a high-efficiency protective paper having functions of heat dissipation, heat conduction and electromagnetic absorption as claimed in claim 1, wherein the thermal conductive composite is made by fully mixing one or more of graphene oxide, expanded graphite and oxidized carbon nanotube with the metal salt and the nano-scale magnetic metal oxide.

4. The method for manufacturing a high-efficiency protective paper having functions of heat dissipation, heat conduction and electromagnetic absorption as claimed in claim 3, wherein the metal salt is iron, cobalt, nickel, organic iron, organic nickel, organic cobalt, ferrocene, nickelocene or cobaltocene.

5. The method for manufacturing a high-efficiency protective paper having functions of heat dissipation, heat conduction and electromagnetic absorption as claimed in claim 3, wherein the metal salt is selected from a group consisting of iron, cobalt, nickel, organic iron, organic nickel, organic cobalt, ferrocene, nickelocene and cobaltocene.

6. The method for manufacturing a high-efficiency protective paper having functions of heat dissipation, heat conduction and electromagnetic absorption as claimed in claim 1, wherein the vacuum furnace is evacuated to have a negative pressure of at least 0.001 Pa.

7. The method for manufacturing a high-efficiency protective paper having functions of heat dissipation, heat conduction and electromagnetic absorption as claimed in claim 1, wherein the vacuum furnace is heated to the temperature of at least 400° C. at a heating rate of 50° C. per minute after being evacuated, maintained at the temperature of at least 400° C. for at least 4 hours, and naturally cooled down to a temperature of 100° C.

8. The method for manufacturing a high-efficiency protective paper having functions of heat dissipation, heat conduction and electromagnetic absorption as claimed in claim 1, wherein the vacuum furnace is maintained at the temperature of at least 400° C. for at least 4 hours.

9. The method for manufacturing a high-efficiency protective paper having functions of heat dissipation, heat conduction and electromagnetic absorption as claimed in claim 1, wherein the vacuum furnace is naturally cooled down to a temperature of 100° C.

* * * * *